(12) United States Patent
Zheleznyak et al.

(10) Patent No.: US 11,049,690 B2
(45) Date of Patent: Jun. 29, 2021

(54) DEPTH-CONTROLLABLE ION MILLING

(71) Applicant: SELA-Solutions EnabLing nano Analysis LTD., Yokneam (IL)

(72) Inventors: Vladimir Zheleznyak, Qiryat Motzkin (IL); Anatoli Eizner, Haifa (IL)

(73) Assignee: SELA—SOLUTIONS ENABLING NANO ANALYSIS LTD., Yokneam (IL)

( * ) Notice: Subject to any disclaimer, the term of this patent is extended or adjusted under 35 U.S.C. 154(b) by 114 days.

(21) Appl. No.: 16/139,044

(22) Filed: Sep. 23, 2018

(65) Prior Publication Data

US 2019/0103251 A1    Apr. 4, 2019

Related U.S. Application Data

(60) Provisional application No. 62/618,647, filed on Jan. 18, 2018, provisional application No. 62/563,065, filed on Sep. 25, 2017.

(51) Int. Cl.

| *G01N 1/32* | (2006.01) |
|---|---|
| *H01J 37/304* | (2006.01) |
| *H01J 37/305* | (2006.01) |
| *H01J 37/30* | (2006.01) |
| *G01N 1/28* | (2006.01) |

(52) U.S. Cl.
CPC .......... *H01J 37/304* (2013.01); *G01N 1/2806* (2013.01); *G01N 1/286* (2013.01); *G01N 1/32* (2013.01); *H01J 37/3005* (2013.01); *H01J 37/3053* (2013.01); *H01J 37/3056* (2013.01); *H01J 2237/30466* (2013.01); *H01J 2237/30472* (2013.01); *H01J 2237/31745* (2013.01)

(58) Field of Classification Search
None
See application file for complete search history.

(56) References Cited

U.S. PATENT DOCUMENTS

| 9,613,874 | B1 * | 4/2017 | Zhu | G01N 23/2251 |
|---|---|---|---|---|
| 2009/0135240 | A1 * | 5/2009 | Phaneuf | G01N 1/286 |
| | | | | 347/246 |
| 2011/0240852 | A1 * | 10/2011 | Tanner | H01J 37/26 |
| | | | | 250/307 |
| 2013/0319849 | A1 * | 12/2013 | Fuller | G01N 1/32 |
| | | | | 204/192.34 |

* cited by examiner

*Primary Examiner* — Jose I Hernandez-Kenney
(74) *Attorney, Agent, or Firm* — Reches Patent

(57) ABSTRACT

A method for depth controlled ion milling, the method may include (a) ion milling a calibrated area and a target area; wherein the ion milling comprises exposing an interior of the calibrated area to provide an exposed interior of the calibrated area; wherein the target area comprises a buried region of interest that is positioned at a certain depth; wherein the calibrated area comprises a certain layer that is positioned at the certain depth; wherein the certain layer is visually distinguishable from another layer of the calibrated area that is precedes the certain layer; (ii) monitoring a progress of the milling by viewing the exposed interior of the calibrated area; and (iii) controlling of the ion milling based on an outcome of the monitoring.

15 Claims, 13 Drawing Sheets

100

110

102

120

130

FIG. 8
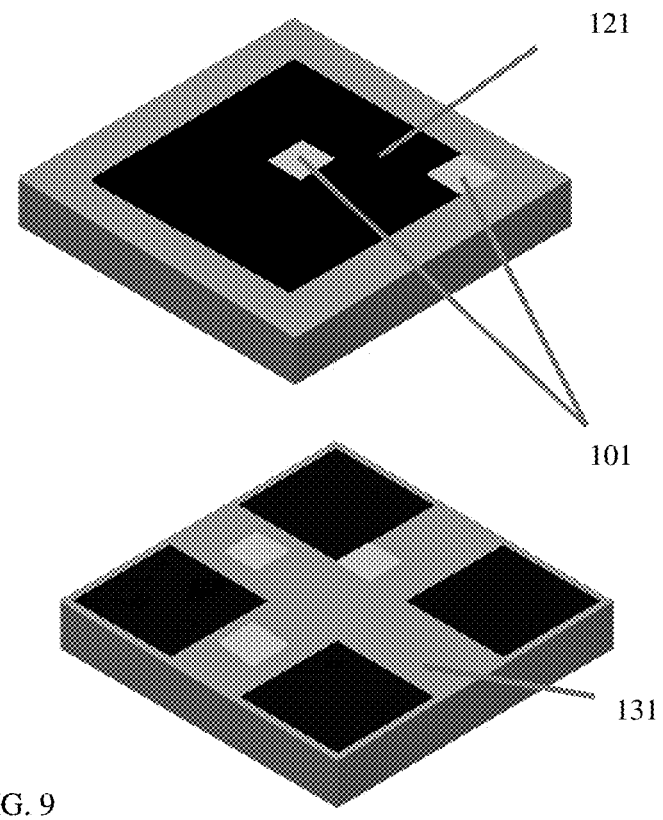
FIG. 9
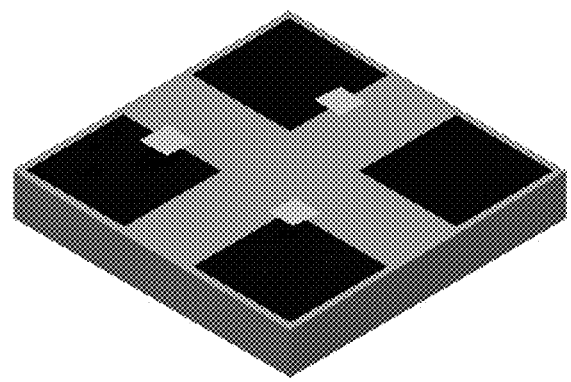
FIG. 10

300

DEPTH-CONTROLLABLE ION MILLING

CROSS REFERENCE

This application claims priority from U.S. provisional patent 62/563,065 filing date 25 Sep. 2017 and from U.S. provisional patent 62/618,647 filing date Jan. 18, 2018.

BACKGROUND OF THE INVENTION

Field of Invention

The invention relates generally to a method for preparing a sample to be observed by a scanning electron microscope (SEM), a transmission electron microscope (TEM), scanning capacitance microscope (SCM) and etc. In particular, the invention relates to method of end-point detection controllable sample preparation by using ion beam.

Background Art

One of important steps in production of semiconductor devices is an intermediate control of product at a stage of its development. There are many methods of control and they are divided into contactless and contact methods. The first group is methods that do not require direct mechanical influence of analytical equipment to tested sample. The second group is associated with direct mechanical contact of the sample with analytical equipment or when non-contact analytical equipment requires a certain preparation of a specimen as in a case of Scanning Electron Microscopy (SEM) and Transmitting Electron Microscopy (TEM).

Briefly describe SEM and TEM technologies. In both cases, a primary electron beam projected on a surface of a sample and interacts with atomic core and electrons that compose it. The results of the interaction are different. SEM technology deals with some incident electrons which were emitted from sample surface to a vacuum before losing all of their energy (backscattered electrons) and electrons which were formed by collisions with the nucleus where substantial energy loss occurs or by the ejection of loosely bound electrons from the sample atoms (secondary electrons). TEM technology operates by primary electrons which are transmitted through a specimen with partial loosing of initial energy (transmitted electrons). Both technologies are using detectors which converts electrical signal of collected electrons to a high-resolution image of a sample.

Both methods of investigation require a certain preparation of the tested sample. In SEM case, a structure should be located on surface of the sample or in the near-surface layers. In a case of TEM technology, the sample presented as thin lamella, tens or hundreds of nanometers, with investigated structure inside it.

There are a few technologies of samples preparation for TEM and SEM analysis but sample preparation by ion beam are leading against the background of a variety of other methods. These methods are more ecological, precise and less laborious.

The methods of ion milling are based on interaction of high-energy accelerated ions of inert gases (typically Xe or Ar) with a surface of sample in vacuum in order to remove material to some desired depth. Variation of ion beam incidence angle, energy of ions, diameter of the ion beam and various movements of the sample during ion milling affects to a sputtering rate of material and to a quality of a final specimen.

One of the main tasks of samples preparation by ion milling is prohibiting of damage of a target. For these purposes, a complete or partial visualization of the milling process is performed by integration optical and/or electron microscopes into ion milling systems. Based on a real image operator can stop the milling process at the right moment.

Nevertheless—common optics tools do not have enough resolution in cases, when an investigated structure has dimension of nanometers. As result, additional equipment should be added to the applicative process.

SUMMARY

There may be provided a method for depth controlled ion milling, the method may include (a) ion milling a calibrated area and a target area; wherein the ion milling may include exposing an interior of the calibrated area to provide an exposed interior of the calibrated area; wherein the target area may include a buried region of interest that may be positioned at a certain depth; wherein the calibrated area may include a certain layer that may be positioned at the certain depth; wherein the certain layer may be visually distinguishable from another layer of the calibrated area that may be precedes the certain layer; (b) monitoring a progress of the milling by viewing the exposed interior of the calibrated area; and |(c) controlling of the ion milling based on an outcome of the monitoring.

The controlling of the ion milling may include stopping the ion milling when detecting the certain layer.

The calibrated area may include multiple sequences of layers, wherein layers of each sequence may be visually distinguishable from each other.

Each layer of the multiple sequences of layers may be of a known thickness, wherein the monitoring of the progress of the milling may include calculating an aggregate thickness of layers that were exposed by the milling and comparing the aggregate thickness to a certain depth.

The at least two layers of the multiple sequences of layers may be of a same thickness.

The at least two layers of the multiple sequences of layers differ from each other by thickness.

There may be two layers per each sequence of layers.

There may be at least three layers per each sequence of layers.

The first layer of the certain layer and the other layer may be made of silicon oxide and wherein a second layer of the certain layer and the other layer may be made of polysilicon.

The monitoring of the progress of the milling may include viewing, by a charged particle device, the exposed interior of the calibrated area.

The monitoring of the progress of the milling may include viewing, by an optical device, the exposed interior of the calibrated area.

The calibrated area may belong to a calibrated sample, wherein the target area belongs to a target sample; wherein the calibrated sample and the target sample that may be attached to each other and may be aligned to each other.

The method may include cleaving one edge of the calibrated sample to provide a calibrated sample cleaved edge; cleaving one edge of the target sample to provide a target sample cleaved edge; aligning the calibrated sample with the target sample; and connecting the calibrated sample cleaved edge to the target sample cleaved edge.

The calibrated area and the target area belong to a target sample.

The target sample may be a wafer and wherein the calibrated area may be located between two dies of the wafer.

The ion milling of the calibrated area and of the target area starts from a milling of a front surface of the calibrated area and of the target area.

The ion milling of the calibrated area and of the target area may start from a milling of a backside surface of the calibrated area and of the target area.

There may be provided a non-transitory computer readable medium that stores instructions that once executed by a computerized system causes the computerized system to execute the steps of: ion milling a calibrated area and a target area; wherein the ion milling may include exposing an interior of the calibrated area to provide an exposed interior of the calibrated area; wherein the target area may include a buried region of interest that may be positioned at a certain depth; wherein the calibrated area may include a certain layer that may be positioned at the certain depth; wherein the certain layer may be visually distinguishable from another layer of the calibrated area that may be precedes the certain layer; monitoring a progress of the milling by viewing the exposed interior of the calibrated area; and controlling of the ion milling based on an outcome of the monitoring.

The controlling of the ion milling may include stopping the ion milling when detecting the certain layer.

There may be provided a computerized system may include an ion miller, a controller, and a monitor; wherein the ion miller may be configured to mill a calibrated area and a target area; wherein the ion milling may include exposing an interior of the calibrated area to provide an exposed interior of the calibrated area; wherein the target area may include a buried region of interest that may be positioned at a certain depth; wherein the calibrated area may include a certain layer that may be positioned at the certain depth; wherein the certain layer may be visually distinguishable from another layer of the calibrated area that may be precedes the certain layer; wherein the monitor may be configured to monitor a progress of the milling by viewing the exposed interior of the calibrated area; and wherein the controller may be configured to control the ion milling based on an outcome of the monitoring.

The controller may be arranged to control the ion milling by stopping the ion milling when detecting the certain layer.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 8-10 are example of calibrated areas;

Figure 1:
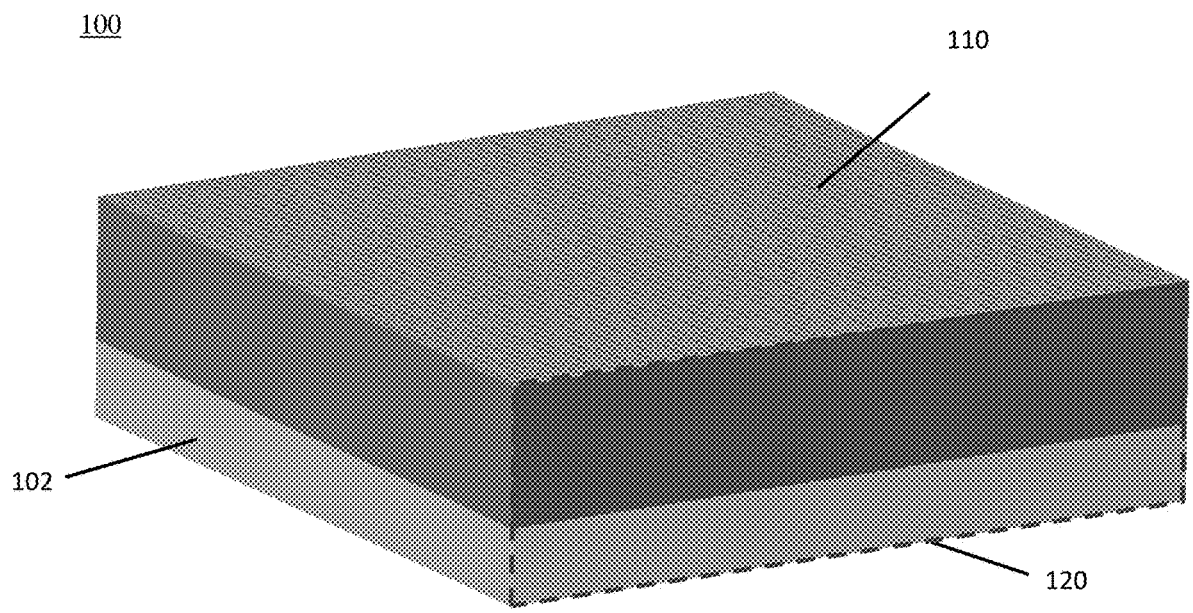
FIG. 1 is an example of a target sample before ion milling.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

There is provided a method for fast and accurate milling for reaching a buried region of interest. The method involves using a calibrated sample that is attached to a target sample. The method may be executed by a system that includes a combination of tools and/or may be controlled by a controller that receives inputs (charged particle images) from a drilled area and determines when to stop an ion milling process.

Any reference to a system should be applied, mutatis mutandis to a method that is executed by the system and/or to a non-transitory computer readable medium that stores instructions that once executed by the system will cause the system to execute the method.

Any reference to method should be applied, mutatis mutandis to a system that is configured to execute the method and/or to a non-transitory computer readable medium that stores instructions that once executed by the system will cause the system to execute the method.

Any reference to a non-transitory computer readable medium should be applied, mutatis mutandis to a method that is executed by a system and/or a system that is configured to execute the instructions stored in the non-transitory computer readable medium. For example—the non-transitory computer readable medium may store instructions for monitoring an ion milling process based on a monitoring of the milling of the calibrated sample.

There is provided a method for the preparation of specimens for analysis by scanning and transmitted electron microscopy which utilizes ion beam milling, and with control of thickness of removed material from a surface of a sample. The process is especially useful for the preparation for analysis by either TEM or SEM wide range of structures based on silicon and sapphire wafers, and especially of 3D NAND and DRAM structures.

The method uses a calibrated sample, which has on a surface a given number of pairwise alternating layers of known thickness. All combination of materials which will be visually separable in SEM and TEM can be used as materials of the layers. To additional the materials should have sufficient electrical conductivity to avoiding the instability of the SEM image, which usually associated with surface charge appearance. In the present invention combination of silicon oxide and poly-silicon is proposed as possible pair of materials.

The thickness of all the layers may be the same. The thickness of at least two layers may differ from each other.

When all the layers are of the same thickness then the thickness of the layer determines the depth resolution. Using layers of the same thickness allows using the same calibrated sample for monitoring the milling of different objects and/or of milling different objects that include regions of interest of different depths.

Alternatively, a calibrated sample may be tailored to fit different milling depths. The tailoring involves manufacturing a calibration layer that include boarders between distinguishable layers at the different milling depths.

The calibrated sample may include more than three types of layers that are distinguishable to a TEM and/or a SEM—and the referral to two types of layers is merely an example. The layers may be arranged in any manner that is known in advance so that the milling process may be accurately monitored by tracking after the exposed layers.

There may be provided a method that may include receiving or generating a combination of a calibrated sample and a target sample that includes a buried region of interest that is positioned at a certain depth. Ion milling the combination thereby exposing the interior of the calibrated sample and the target sample while monitoring the depth of milling by viewing (for example by a charged particle tool such as a TEM or a SEM) the exposed interior of the calibrated sample—until reaching the certain depth and stopping the milling when reaching the certain depth. The calibrated sample include layers that are distinguishable from each other (to the charged particle tool) of known depth.

The generation of the combination may include one or more preparation steps such as (i) Preparation of the target sample by cleaving edges close to target location alone one of silicon crystallographic directions. (ii) Preparation of calibrated sample by cleaving one edge alone of silicon crystallographic directions. (iii) Combining of the target sample and calibrated sample over the cleaved edges. (iv) Aligning by height the target sample and calibrated sample top surfaces.

A preparation of calibrated sample and sample for ion milling is described below. A size of the target sample is chosen based on area on its surface, which will be etched to ensure proper study of the structure. Hence, the linear dimensions of a piece of the calibrated sample are chosen no less than the linear dimensions of the expected etched area.

The target sample presented by silicon or sapphire plate with specified linear dimension. The investigated structure is located on the surface of the target sample (FIG. 1, sample). One of the edges of the target sample which will be combining with the calibrated sample should have the quality enough for the combination of the two samples with the minimum gap between them. Such quality of the edge is possible to receive just by cleaving of a silicon wafer, for example, alone one of its crystallographic directions. In a case of specific target, when certain place of structure need to be investigated, the cleave must pass through this place.

Figure 2:
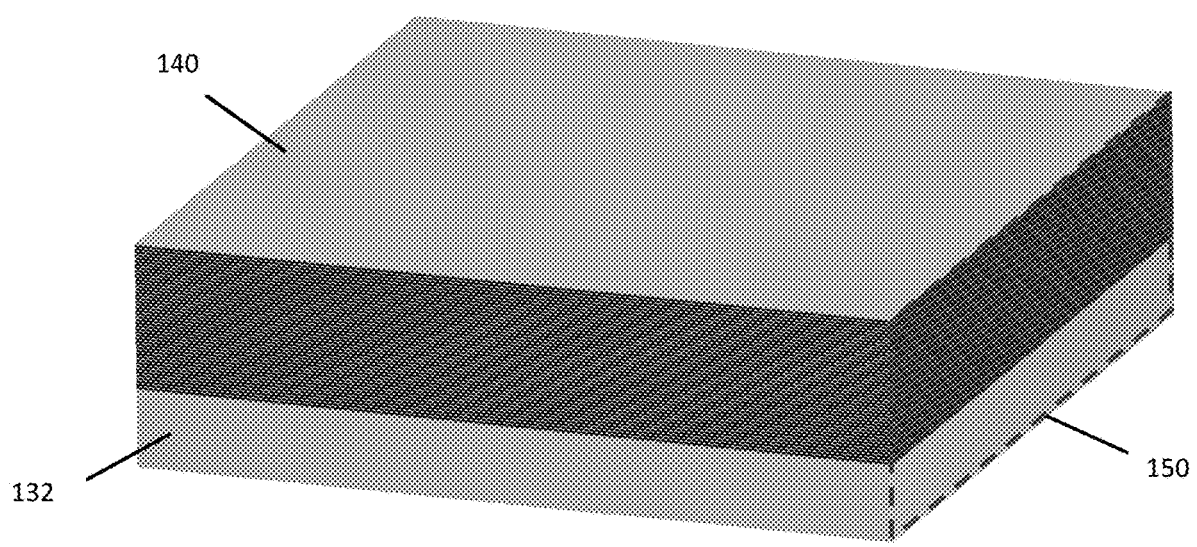
FIG. 2 is an example of a calibrated sample before ion milling.

The calibrated sample may have a silicon base. The total thickness of the layers of the calibrated sample should be equal or more than the thickness of a structure of the target sample (FIG. 2, calibrated sample). One of the edges of the calibrated sample, which will be combined with the target sample, must also be prepared by the method of the cleaving through one of crystallographic directions.

The method described below involves front Side Milling. Using one of such methods as conductive vacuum glue or silver paint or carbon tape, the target sample and calibrated sample fixes on the flat surface of a sample holder by silicon (sapphire) sides. Then the target sample and the calibrated sample combines over the above-mentioned edges, prepared by the cleaving. Finally, both samples are aligned by height, that is, the surface of the structure of the target sample and the top surface of the calibrated sample should be located at the same distance from the surface of the sample holder (FIG. 3, combined target sample and calibrated sample). In a case of vacuum glue or silver paint using, short time should be taken for them proper curing.

The sample holder is placed into the ion milling system and the ion milling of the structure begins. The milling process can be accompanied by rotating the sample holder about axis R perpendicular to its plane (XY), or by rotation about axis T2 perpendicular to plane XZ, or by rotation about axis or T1 perpendicular to plane YZ, or by movement of a sample holder along axes X, Y or Z, or by rotation of the ion beam above optical axis of the Ion Miller (FIG. 4, schematic position of the sample holder in vacuum chamber of ion milling system).

The rotation enhances the uniformity of the milled hole.

During the ion milling process the ion beam sputters as surface of the target sample as the structure of the calibrated sample. Result of the calibrated sample milling is a groove with a set of different contrasted or colored alternate layers on the slope (FIG. 5, etched target sample and calibrated sample to tierce of depth) (FIG. 6, etched target sample and calibrated sample until silicon base). During the milling performs calculation of number of the layers on the slope. When the total thickness of the layers on the slope becomes equals to a depth on which the structure of the sample must be studied, the ion etching process stops.

The method may involve using Back Side Milling Process. Using the same methods of fixation, the target sample and calibrated sample places on the flat surface of the sample holder by structure side. The total thickness of the layers of the calibrated sample should be more than the thickness of a structure of the target sample. It's advisable that a total thickness of the target sample and calibrated sample will be approximately same. Then the target sample and the calibrated sample combines over the cleaved edges and finally both samples should be aligned by height, that is, the silicon (sapphire) surface of the target sample and the top silicon surface of the calibrated sample should be locates at the same distance from the surface of the sample holder.

The sample holder is placed into the ion milling system and the ion milling of the structure begins with the same variation rotation and motions as described above for Front Side Ion Milling Process. The main goal of this application to reach by ion milling some point of the structure which locates on defined distance from silicon substrate. During this process operator observe appearance of a groove on a top combined surface of target sample/calibrated sample. Ion milling process immediately stops when a structure of the target sample becomes bare. From this moment, controllable ion milling process took place by etching with simultaneous calculation of the layer on a slope of calibrated sample. The ion milling process stops when the total thickness of the layers on the slope becomes equals to the distance on which the structure of the target sample must be studied (FIG. 7, results of back Side Ion Milling Process).

FIG. 1 shows a typical target sample 100 which includes of silicon or sapphire base 102 and top structure 110. The sample has cleaved edge 120 coinciding with one of crystallographic directions of the silicon base 102.

FIG. 2 shows calibrated sample 130 which includes of silicon base 132 and set of pairwise alternating layers 140 of known thickness on the top. The calibrated sample has cleaved edge 150 coinciding with one of crystallographic directions of the silicon base 132.

Figure 3:
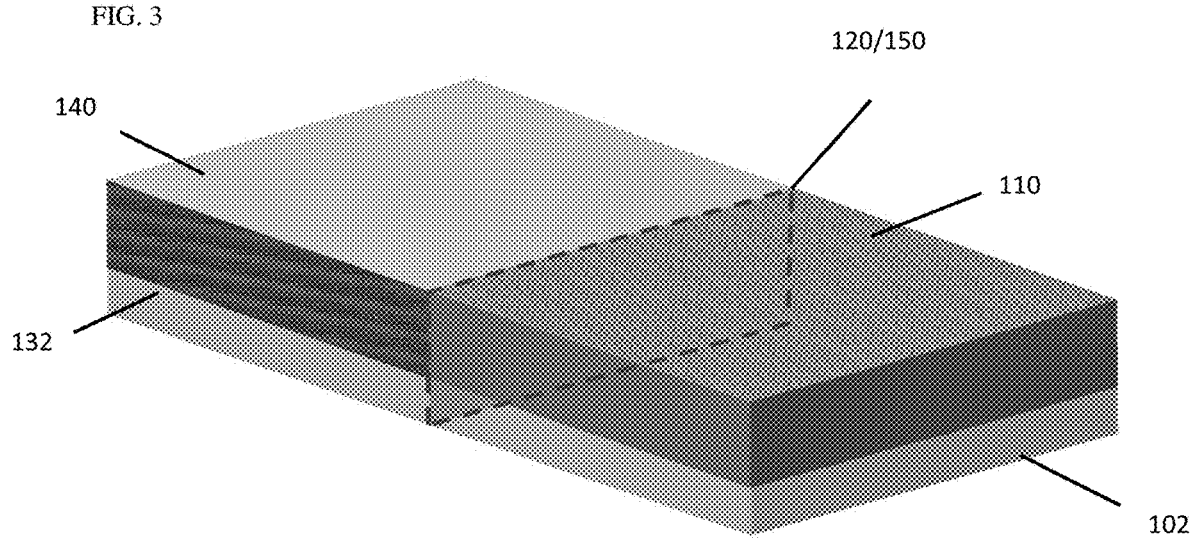
FIG. 3 is an example of combined target sample and calibrated sample before front side ion milling process.

FIG. 3 shows combined target sample 100 and calibrated sample 130 over cleaved edges 120 and 150.

Figure 4:
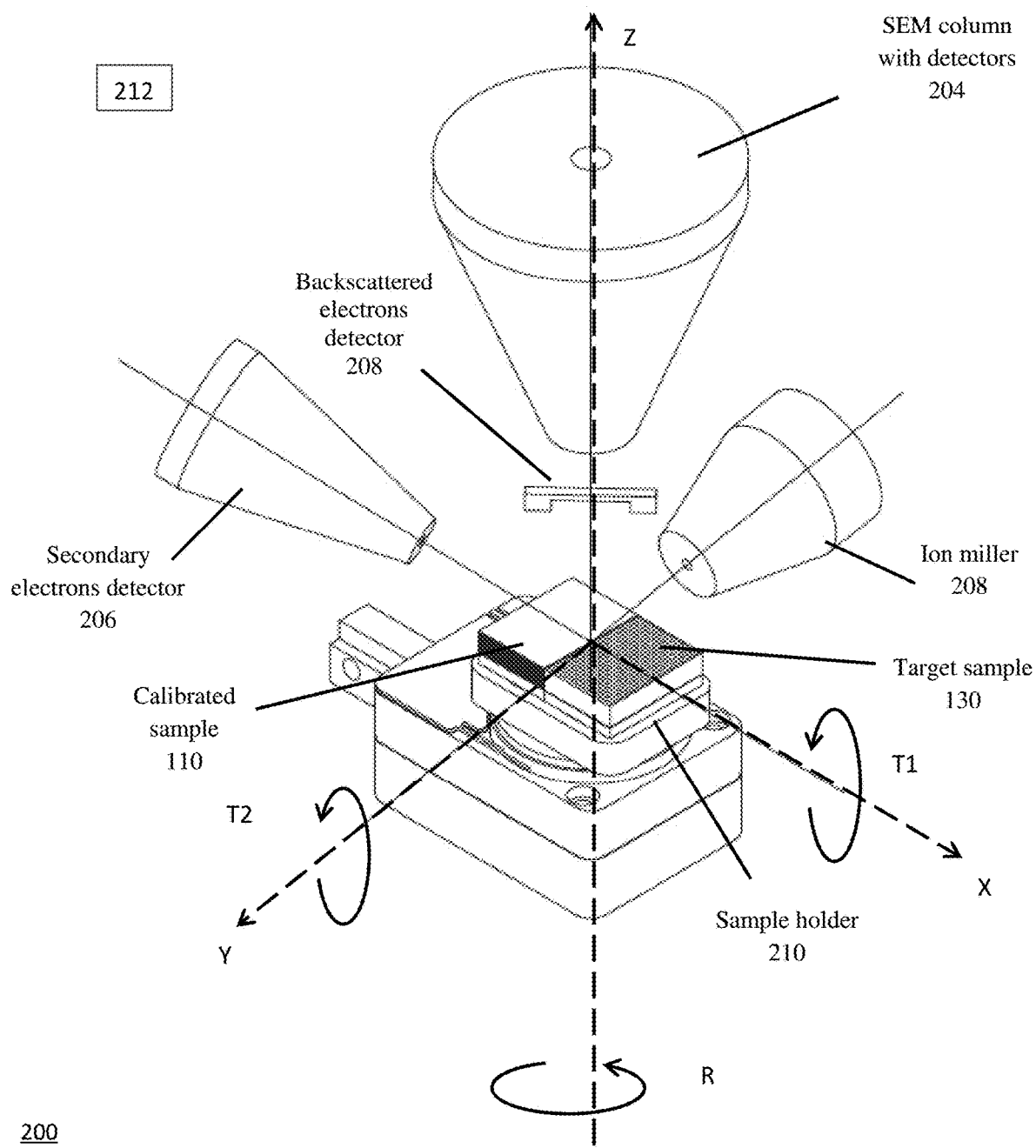
FIG. 4 is an example of a computerized system.

FIG. 4 schematic position of the sample holder in vacuum chamber of ion milling system. FIG. 4 illustrates a computerized system 200 that includes an Ion miller 208, a monitor that include a SEM column 204 and detectors such as secondary electron detector SED 206 and backscattered electron detector BSED 208. The computerized system 200 also includes a sample holder 210 for holding the combined target sample and calibrated sample—and a controller 212 for controlling the computerized system.

Figure 5:
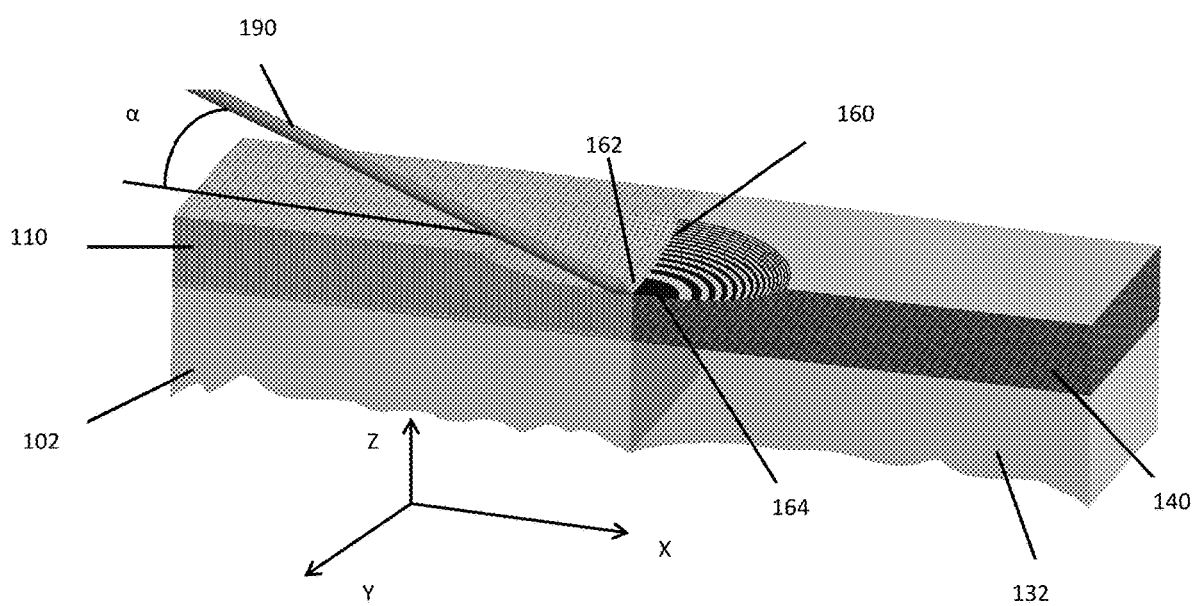
FIG. 5 is an example of an etched target sample and calibrated sample to tierce of depth.

FIG. 5 shows combined target sample and calibrated sample after the beginning of the ion milling to tierce of depth of target sample structure. Ion beam 190 mills the combined target sample and calibrated sample.

A hole 160 is formed in both the target sample and calibrated sample as result of the milling.

In FIG. 5 the hole is formed only in part of the top structure 110 of target sample and in only some of the layers 140 of calibrated sample.

From target sample side, the hole 160 exposes an exposed interior of the top structure 110 and exposes some of layers 140. The bottom of the hole exposes part 162 of the top structure and a part 164 of one of the layers.

Figure 6:
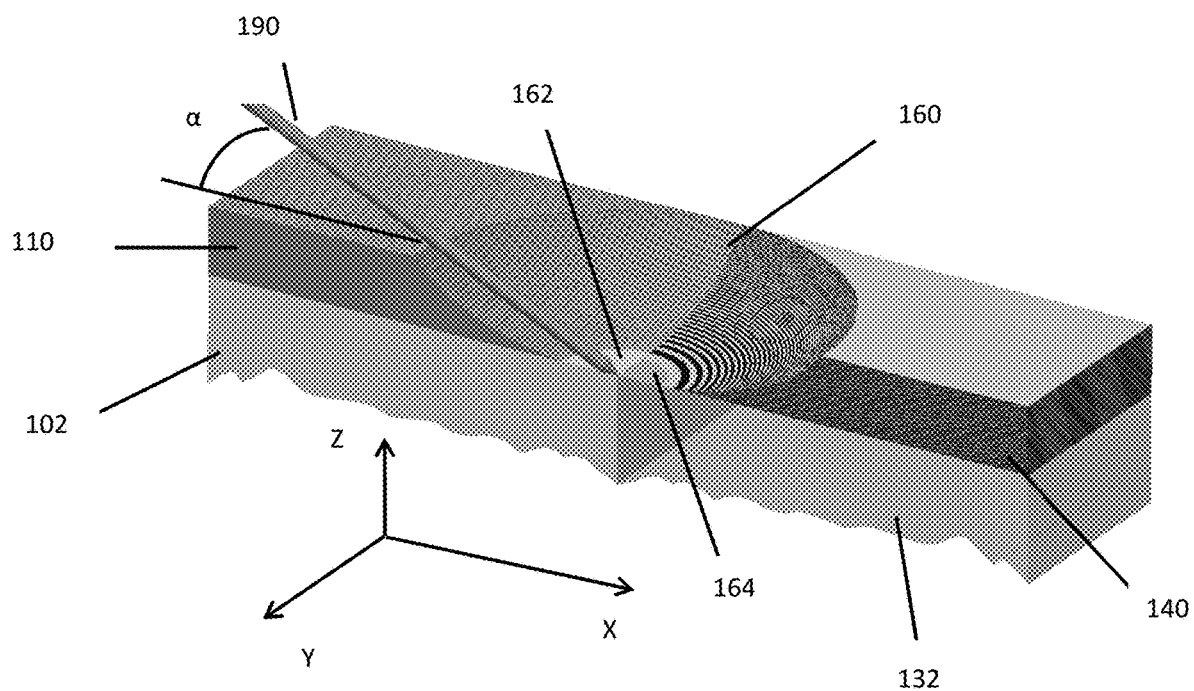
FIG. 6 is an example of an etched target sample and calibrated sample until silicon base.

FIG. 6 shows combined target sample and calibrated sample after the exposure of the silicon bases 102 and 132.

From target sample side, the hole 160 exposes an exposed interior of the top structure 110, and from the calibrated sample side, the hole exposes all layers 140. The bottom of the hole exposes part 162 of silicon base 102 and a part 164 of one of silicon base 132.

Figure 7:
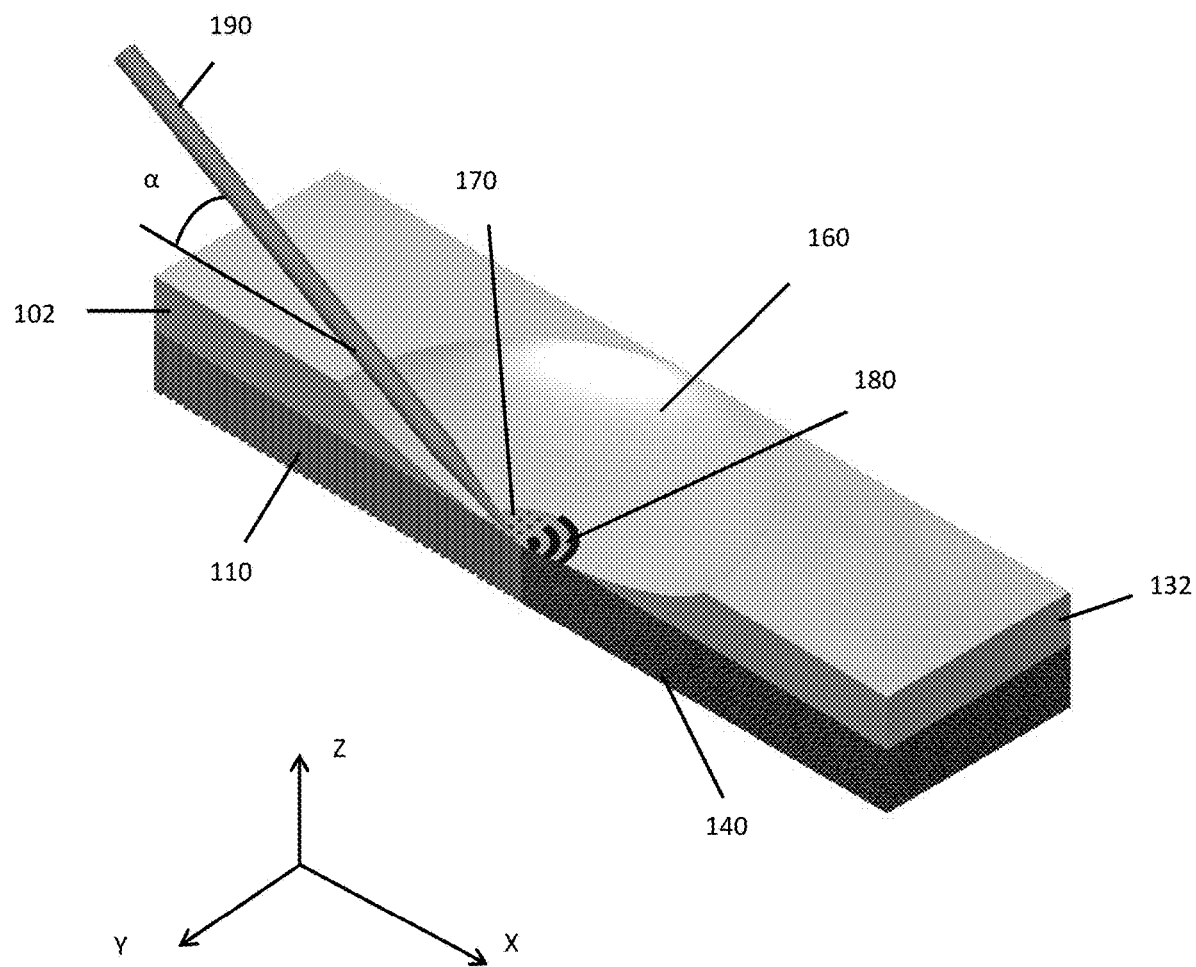
FIG. 7 is an example of a etched target sample and calibrated sample that was back side ion milled.

FIG. 7 illustrates results of back Side Ion Milling Process. Hole 160 is formed mainly in silicon base 102 and silicon base 132—but proceeds and exposes a part 180 of one or more layers (of layers 140) and a part 170 of the top structure 110.

There may be provided a method of controllable end point detection ion milling by using calibrated sample with depth calibrated structure. The method may include (i) Preparation of the target sample by cleaving edges close to target location alone one of silicon crystallographic directions. (ii) Preparation of calibrated sample by cleaving one edge alone of silicon crystallographic directions. (iii) Combining of the target sample and calibrated sample over the cleaved edges. (iv) Aligning by height the target sample and calibrated sample top surfaces. (v) Ion milling. (vi) Monitoring of depth of penetration into target sample surface by calculation of number of the layers on the slope of groove of calibrated sample. (v) The method may include using a calibrated sample which has on a surface a given number of pairwise alternating layers of known thickness.

The materials of the layers of the calibrated sample will be visually separable in SEM and TEM The calibrated sample may include silicon oxide layers and poly-silicon layers as pairs of materials of layers of the calibrated sample structure The end-point detection of target may be realized by calculation number of layers on the slope of the groove in surface of the calibrated sample The calibrated sample may include a depth calibrated structure.

There is provided a method for the preparation of specimens for analysis by scanning and transmitted electron microscopes which utilizes ion beam milling, and with control of thickness of removed material from a surface of a sample. The process is especially useful for the preparation for analysis by either TEM or SEM wide range of semiconductor structures, and especially of 3D NAND and DRAM.

The method uses a calibrated area which presented by a given number of pairwise alternating layers of known thickness and which locates on target sample (FIG. 1, a perspective view of a calibrated area). All combination of materials which will be visually separable in SEM and TEM can be used as materials of the layers. To additional the materials should have sufficient electrical conductivity to avoiding the instability of the SEM image, which usually associated with surface charge appearance. In the present invention combination of silicon oxide and poly-silicon is proposed as possible pair of materials.

The thickness of all the layers may be the same. The thickness of at least two layers may differ from each other.

When all the layers are of the same thickness then the thickness of the layer determines the depth resolution. Using layers of the same thickness allows using the same calibrated area for monitoring the milling of different objects and/or of milling different objects that include regions of interest of different depths.

Alternatively, a calibrated area may be tailored to fit different milling depths. The tailoring involves manufacturing a calibration layer that include boarders between distinguishable layers at the different milling depths.

The calibrated area may include more than three types of layers that are distinguishable to a TEM and/or a SEM—and the referral to two types of layers is merely an example. The layers may be arranged in any manner that is known in advance so that the milling process may be accurately monitored by tracking after the exposed layers.

Total thickness of layers of the calibrated area may be equal, less or greater that total thickness of structure of target sample.

The target sample can be presented by whole silicon or sapphire wafer which comprises of dice and areas between dice; or by piece of the silicon or sapphire wafer which comprises of single die or area between dice, part of die or area between dice, any possible combination of dice and areas between dice.

The target sample may contain minimum one calibrated area.

The calibrated area may locates in die, in area between dice or in interface between die and area between dice (FIGS. 8-10 illustrates possible integrations of calibrated areas into die (FIG. 8), into area between dice (FIG. 9) and in interface between dice and area between dice (FIG. 10)).

A shape of the calibrated area may be diverse.

There may be provided a method that may include receiving target sample that includes a buried region of interest that is positioned at a certain depth and calibrated area which is integrated into target sample. Ion milling the combination thereby exposing the interior of the calibrated area and the target sample while monitoring the depth of milling by viewing (for example by optical device or a charged particle tool such as TEM or SEM) the exposed interior of the calibrated area—until reaching the certain depth and stopping the milling when reaching the certain depth. The calibrated area includes layers of known depth which are distinguishable from each other (in case of the charged particle tool).

The calibrated area may be created during growing of integrated circuits on silicon or sapphire wafer or the calibrated area can be integrated separately into target sample. Top surface of structure of target sample and top surface of calibrated area may lie in one plane.

Method of ion milling of target sample is described below.

Using one of such methods as conductive vacuum glue or silver paint or carbon tape, the target sample fixes on the flat surface of a sample holder by silicon/sapphire side. The sample holder is placed into the ion milling system and the ion milling of the structure begins. The milling process can be accompanied by rotating the sample holder about axis R perpendicular to its plane (XY), or by rotation about axis T1 perpendicular to plane YZ, or by rotation about axis T2 perpendicular to plane XZ, or by movement of a sample holder along axes X, Y or Z, or by rotation of the ion beam above optical axis of the Ion miller. The ion miller has six freedoms—X, Y, Z, T3, T4 and T5 (FIG. 11, schematic position of the sample holder in vacuum chamber of ion milling system with charge particles tool; FIG. 12, schematic position of the sample holder in vacuum chamber of ion milling system with optical device). The rotation enhances the uniformity of the milled hole and decrease roughness of its surface.

During the ion milling the ion beam sputters surface of the sample. Result of the milling is a groove appearance on a surface of target sample. If the bottom of groove coincides with calibrated area, periodical changing of color or contrast of the bottom will observe through the milling (FIG. 13, etched sample when bottom of groove coincides with calibrated area location). During the milling performs counting of color changes of the bottom and it is equal to a number of sputtered layers of the calibrated area. If the bottom of groove does not coincide with calibrated area, section of the slope of the groove which includes milled calibrated area will be presented by set of different contrasted or colored alternate layers (FIG. 14, etched sample when bottom of groove does not coincide with calibrated area location). In this case performs calculation of the layers on the slope of the milled calibrated area. When the total thickness of the layers becomes equals to a depth on which the structure of the sample must be studied, the ion etching process stops.

FIG. 8 shows perspective view of calibrated areas 101 integrated into die 121. FIG. 9 illustrates calibrated areas 101 integrated into area 131 between dice. FIG. 10 illustrates calibrated areas 101 that are integrated into interface between dice 121 and area 131 between dice.

Figure 11:
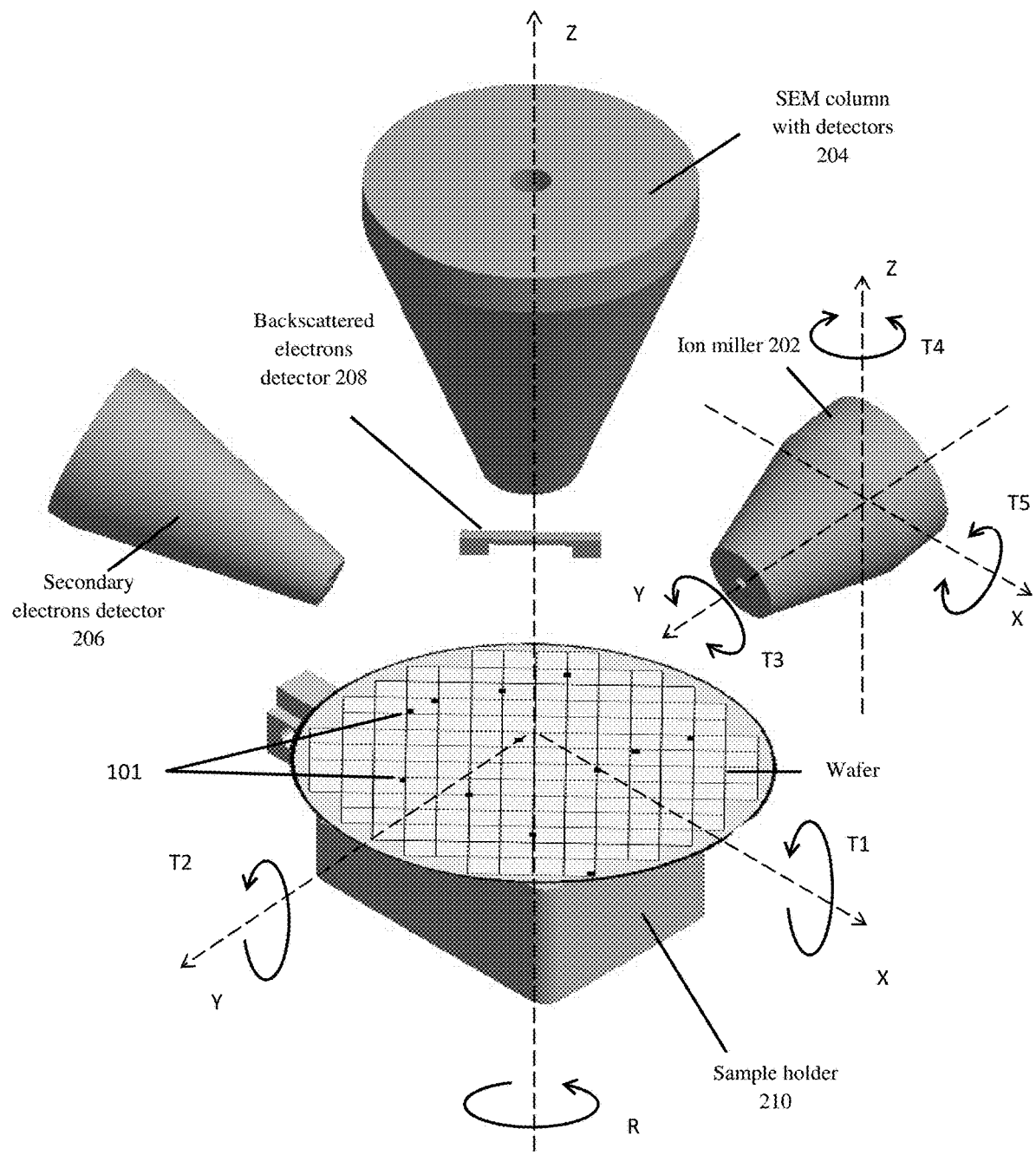
FIG. 11 is an example of a computerized system.
Figure 12:
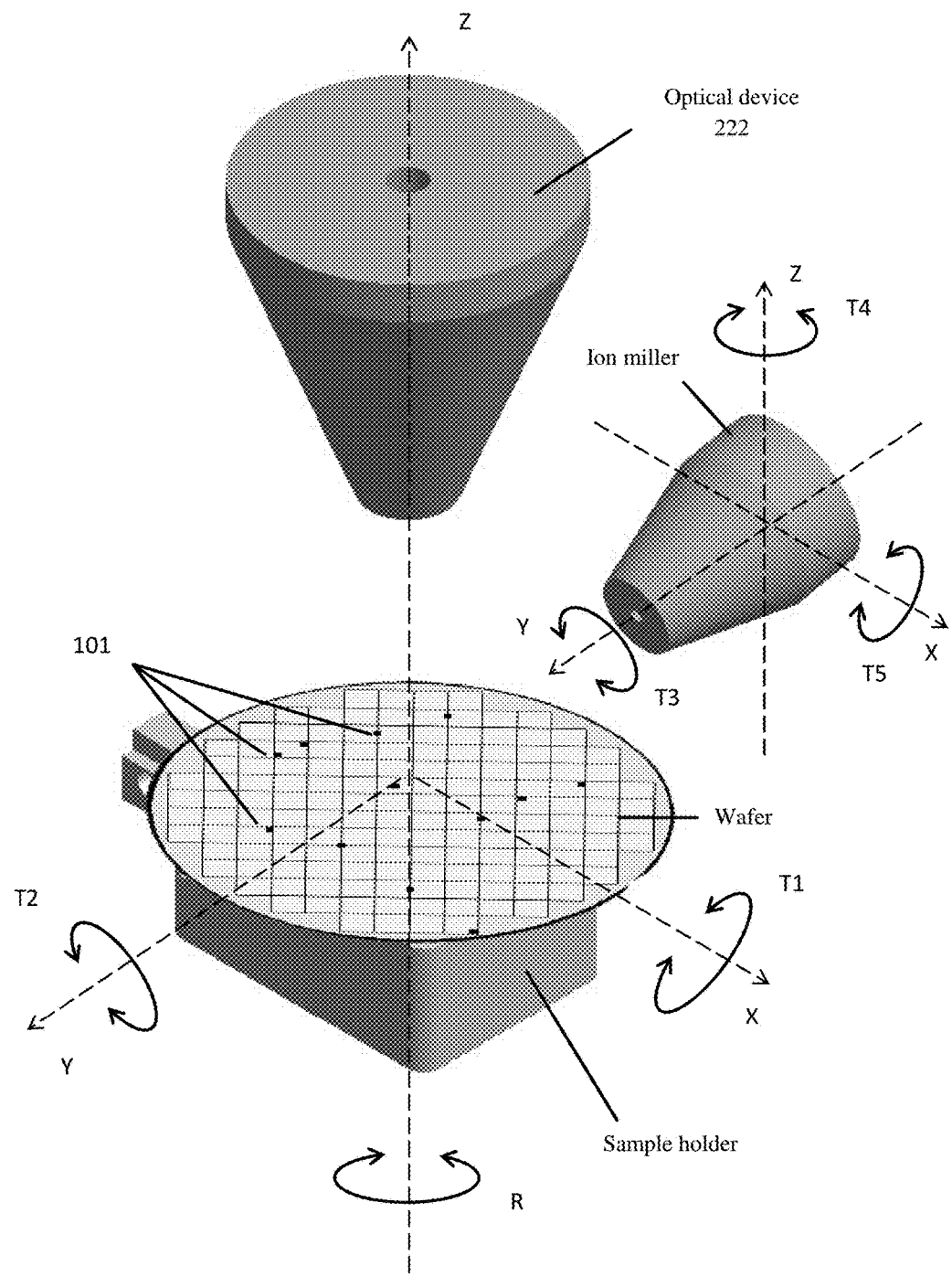
FIG. 12 is an example of a computerized system.

FIG. 11 shows an example of a computerized system 201 that includes an ion miller 202, a monitor that include a SEM column with detectors 204 as well as additional detectors such as secondary electron detector SED 206 and backscattered electron detector BSED 208. The computerized system 201 also includes a sample holder 210 for holding the combined target sample with integrated calibrated area/ areas—and a controller 212 for controlling the computerized system.

Computerized system 201 (as well as 200) may also include a vacuum chamber.

FIG. 12 shows an example of a computerized system 203 that includes a monitor that has an optical device 222 such as an optical microscope.

There may be one or more calibration area in the die. An optimal milling may involve mainly (or solely) milling the calibration area and not other parts of the integrated circuit.

Figure 13:
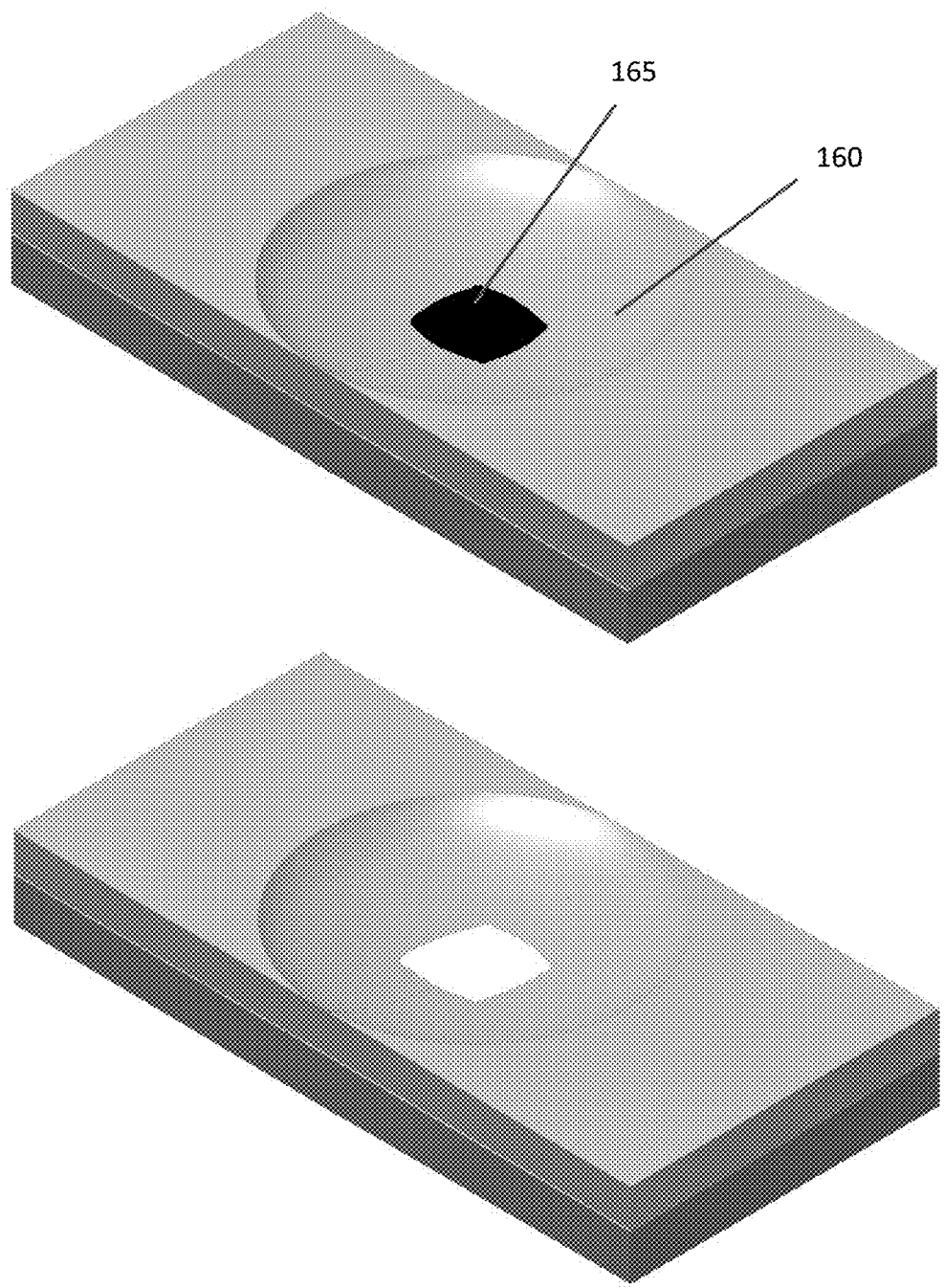
FIG. 13 is an example of etched samples.

FIG. 13 illustrates examples in which the milling mainly mills the calibrated area. The calibrated area has alternating black and while layers and thus the two images of FIG. 13 illustrate different depths of milling that expose a black layer or a white layer. The upper part of FIG. 13 illustrates a bottom of hole 160 that coincides with a black layer 165 of a first depth while the lower part of FIG. 13 illustrates a bottom of hole 160 that coincides with a white layer of a second depth.

Figure 14:
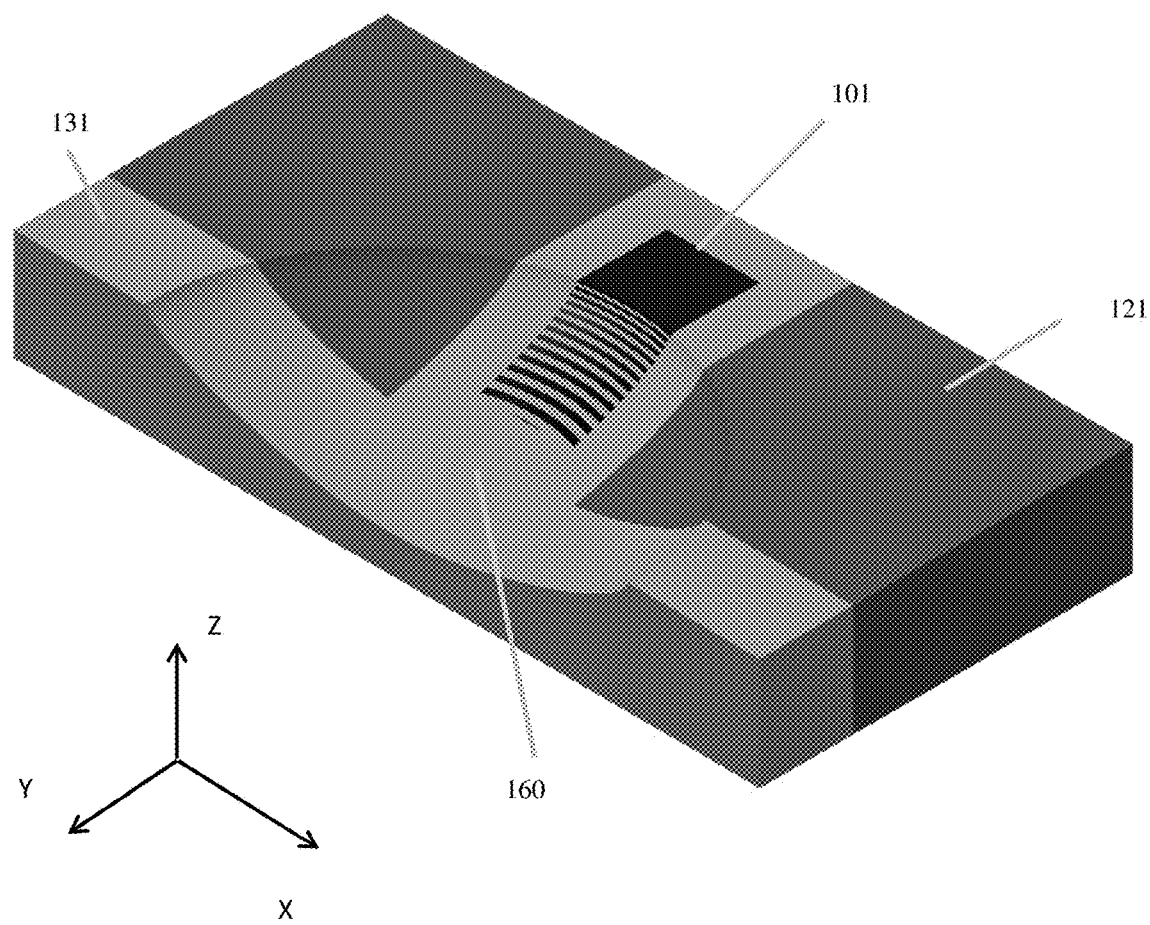
FIG. 14 is an example of an etched sample.

FIG. 14 shows an etched sample in which the calibrated area 101 is located at an area 131 between dice. In FIG. 14 the hole 160 exposes a only a part of the calibration area (leaving alternating layers exposed)—while another part of the calibration area (that is not milled) has an upper layer that is located at the upper surface of the integrated circuit. The bottom of hole does not coincide with the calibrated area location.

There may be provided a method of controllable end point detection ion milling by using integrated into target sample calibrated area with depth calibrated structure. The method may include (i) Preparation of the target sample which composed even one calibrated area (ii) Ion milling. (iii) Monitoring of depth of penetration into target sample surface by calculation of number of the layers on the slope/the bottom of groove which is included milled calibrated area. (iv) The method may include using a calibrated area which has on a surface a given number of pairwise alternating layers of known thickness.

The materials of the layers of the calibrated area will be visually separable in SEM and TEM.

The calibrated area may include silicon oxide layers and poly-silicon layers as pairs of materials of layers of the calibrated area structure.

The end-point detection of target may be realized by calculation number of layers on the slope/the bottom of the groove which is included milled calibrated area.

The calibrated area may include a depth calibrated structure.

Figure 15:
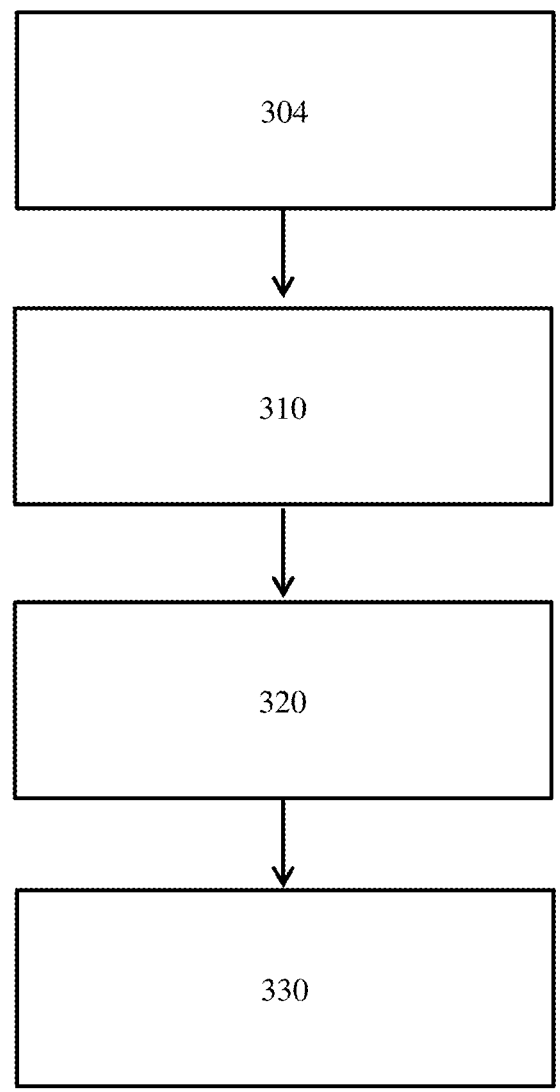
FIG. 15 illustrates an example of a method.

FIG. 15 illustrates method 300.

Method 300 is for depth controlled ion milling.

Method 300 may include:

Step 310 of ion milling a calibrated area and a target area. The ion milling may include exposing an interior of the calibrated area to provide an exposed interior of the calibrated area. The target area may include a buried region of interest that may be positioned at a certain depth. The calibrated area may include a certain layer that may be positioned at the certain depth. The certain layer may be visually distinguishable from another layer of the calibrated area that may be precedes the certain layer.

Step 320 of monitoring a progress of the milling by viewing the exposed interior of the calibrated area.

Step 330 of controlling of the ion milling based on an outcome of the monitoring.

Step 330 may include stopping the ion milling when detecting the certain layer.

The calibrated area may include multiple sequences of layers, wherein layers of each sequence may be visually distinguishable from each other.

Each layer of the multiple sequences of layers may be of a known thickness, wherein the monitoring of the progress of the milling may include calculating an aggregate thickness of layers that were exposed by the milling and comparing the aggregate thickness to a certain depth.

At least two layers of the multiple sequences of layers may be of a same thickness.

At least two layers of the multiple sequences of layers may differ from each other by thickness.

There may be two layers per each sequence of layers.

There may be at least three layers per each sequence of layers.

A first layer of the certain layer and the other layer may be made of silicon oxide and wherein a second layer of the certain layer and the other layer may be made of poly-silicon.

Step 320 may include viewing, by a charged particle device, the exposed interior of the calibrated area.

Step 320 may include viewing, by an optical device, the exposed interior of the calibrated area.

The calibrated area may belong to a calibrated sample, wherein the target area may belong to a target sample;

wherein the calibrated sample and the target sample that may be attached to each other and may be aligned to each other.

Method 300 may also include step 304 of cleaving one edge of the calibrated sample to provide a calibrated sample cleaved edge; cleaving one edge of the target sample to provide a target sample cleaved edge; aligning the calibrated sample with the target sample; and connecting the calibrated sample cleaved edge to the target sample cleaved edge.

The calibrated area and the target area may belong to a target sample.

The target sample may be a wafer and wherein the calibrated area may be located between two dice of the wafer.

Step 310 may include downwards milling—starting the milling by milling of a front surface of the calibrated area and of the target area.

Step 310 may include upwards milling—starting from a milling of a backside surface of the calibrated area and of the target area.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the pool cleaning robot and the mobile computer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

Any system, apparatus or device referred to this patent application includes at least one hardware component.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for depth controlled ion milling, the method comprises:
ion milling a calibrated area and a target area; wherein the ion milling comprises exposing an interior of the calibrated area to provide an exposed interior of the calibrated area; wherein the target area comprises a buried region of interest that is positioned at a certain depth; wherein the calibrated area comprises a certain layer that is positioned at the certain depth; wherein the certain layer is visually distinguishable from another layer of the calibrated area that is precedes the certain layer;
monitoring a progress of the milling by viewing the exposed interior of the calibrated area;
controlling of the ion milling based on an outcome of the monitoring;
wherein the calibrated area comprises multiple sequences of layers, wherein layers of each sequence are visually distinguishable from each other; and
wherein each layer of the multiple sequences of layers is of a known thickness, wherein the monitoring of the progress of the milling comprises calculating an aggregate thickness of layers that were exposed by the milling and comparing the aggregate thickness to the certain depth.

2. The method according to claim 1 wherein the controlling of the ion milling comprises stopping the ion milling when detecting the certain layer.

3. The method according to claim 1 wherein at least two layers of the multiple sequences of layers are of a same thickness.

4. The method according to claim 1 wherein at least two layers of the multiple sequences of layers differ from each other by thickness.

5. The method according to claim 1 wherein there are two layers per each sequence of layers.

6. The method according to claim 1 wherein there are at least three layers per each sequence of layers.

7. The method according to claim 1 wherein a first layer of the certain layer and the other layer is made of silicon oxide and wherein a second layer of the certain layer and the other layer is made of poly-silicon.

8. The method according to claim 1 wherein the monitoring of the progress of the milling comprising viewing, by a charged particle device, the exposed interior of the calibrated area.

9. The method according to claim 1 wherein the monitoring of the progress of the milling comprising viewing, by an optical device, the exposed interior of the calibrated area.

10. The method according to claim 1 wherein the calibrated area and the target area belong to a target sample.

11. The method according to claim 10 wherein the target sample is a wafer and wherein the calibrated area is located between two dice of the wafer.

12. The method according to claim 1 wherein the ion milling of the calibrated area and of the target area starts from a milling of a front surface of the calibrated area and of the target area.

13. The method according to claim 1 wherein the ion milling of the calibrated area and of the target area starts from a milling of a backside surface of the calibrated area and of the target area.

14. A method for depth controlled ion milling, the method comprises:
ion milling a calibrated area and a target area; wherein the ion milling comprises exposing an interior of the calibrated area to provide an exposed interior of the calibrated area; wherein the target area comprises a buried region of interest that is positioned at a certain depth; wherein the calibrated area comprises a certain layer that is positioned at the certain depth; wherein the certain layer is visually distinguishable from another layer of the calibrated area that is precedes the certain layer;
monitoring a progress of the milling by viewing the exposed interior of the calibrated area; and
controlling of the ion milling based on an outcome of the monitoring;
wherein the calibrated area belongs to a calibrated sample, wherein the target area belongs to a target sample; wherein the calibrated sample and the target sample that are attached to each other and are aligned to each other.

15. The method according to claim 14 comprising:
cleaving one edge of the calibrated sample to provide a calibrated sample cleaved edge;
cleaving one edge of the target sample to provide a target sample cleaved edge;
aligning the calibrated sample with the target sample; and
connecting the calibrated sample cleaved edge to the target sample cleaved edge.

* * * * *